United States Patent
Chang et al.

(10) Patent No.: US 11,200,396 B2
(45) Date of Patent: Dec. 14, 2021

(54) TOUCHED ELECTRONIC DEVICE

(71) Applicant: InnoLux Corporation, Miao-Li County (TW)

(72) Inventors: Kuei-Sheng Chang, Miao-Li County (TW); Kuo-Jung Wu, Miao-Li County (TW); Po-Yang Chen, Miao-Li County (TW); I-An Yao, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/901,009

(22) Filed: Jun. 15, 2020

(65) Prior Publication Data

US 2021/0012078 A1    Jan. 14, 2021

(30) Foreign Application Priority Data

Jul. 12, 2019  (CN) .......................... 201910630012.5

(51) Int. Cl.
   *G06K 9/00*    (2006.01)
   *G06F 3/041*   (2006.01)

(52) U.S. Cl.
   CPC ......... *G06K 9/0002* (2013.01); *G06F 3/0412* (2013.01); *G06F 3/04166* (2019.05); *G06K 9/0004* (2013.01)

(58) Field of Classification Search
   None
   See application file for complete search history.

(56) References Cited

U.S. PATENT DOCUMENTS

| | | | | |
|---|---|---|---|---|
| 2016/0350570 A1* | 12/2016 | Han | .................... | G06F 3/04164 |
| 2017/0124370 A1* | 5/2017 | He | .................... | G06K 9/0002 |
| 2017/0336910 A1* | 11/2017 | Han | .................... | G06F 3/041661 |
| 2018/0060641 A1* | 3/2018 | Kim | .................... | G06K 9/0004 |
| 2018/0151656 A1* | 5/2018 | Choo | .................... | G09G 3/3233 |
| 2018/0349667 A1 | 12/2018 | Kim | | |
| 2019/0155429 A1* | 5/2019 | Kim | .................... | G06F 3/0421 |
| 2020/0051499 A1* | 2/2020 | Chung | .................... | G09G 5/377 |
| 2020/0327301 A1* | 10/2020 | Shih | .................... | G06F 3/04166 |

* cited by examiner

*Primary Examiner* — Chad M Dicke
(74) *Attorney, Agent, or Firm* — Winston Hsu

(57) ABSTRACT

An electronic device has a touch sensing mode and a fingerprint sensing mode, and the electronic device includes a substrate, a driving circuit, a fingerprint sensor and a touch signal line. The driving circuit is disposed on the substrate. The fingerprint sensor is disposed on the substrate, and the fingerprint sensor includes a first electrode and a second electrode, wherein the first electrode is electrically connected to the driving circuit. The touch signal line is disposed on the substrate and electrically connected to the second electrode.

16 Claims, 9 Drawing Sheets

TOUCHED ELECTRONIC DEVICE

CROSS REFERENCE TO RELATED APPLICATION

This application claims the priority benefit of China application serial No. 201910630012.5, filed on Jul. 12, 2019. The entirety of the above-mentioned patent application is hereby incorporated by reference herein and made a part of this specification.

BACKGROUND OF THE DISCLOSURE

1. Field of the Disclosure

The present disclosure relates to an electronic device, and more particularly to an electronic device having a touch sensing mode and a fingerprint sensing mode.

2. Description of the Prior Art

Users can be directly identified by fingerprint identification without memorizing passwords, so as to provide the use with convenience and safety. Thus, industries recently make effort integrating a touch sensing function, a fingerprint sensing function and an image display function in the same electronic device. However, there are many issues needing to be resolved.

SUMMARY OF THE DISCLOSURE

According to an embodiment, the present disclosure provides an electronic device having a touch sensing mode and a fingerprint sensing mode. The electronic device includes a substrate, a driving circuit, a fingerprint sensor and a touch signal line. The driving circuit is disposed on the substrate. The fingerprint sensor is disposed on the substrate, and the fingerprint sensor includes a first electrode and a second electrode, wherein the first electrode is electrically connected to the driving circuit. The touch signal line is disposed on the substrate and electrically connected to the second electrode.

According to another embodiment, the present disclosure provides an electronic device having a touch sensing mode and a fingerprint sensing mode. The electronic device includes a substrate, a driving circuit, a touch electrode and a fingerprint sensor. The driving circuit, the touch electrode and the fingerprint sensor are disposed on the substrate, wherein the fingerprint sensor includes a fingerprint sensing electrode disposed on the touch electrode and electrically connected to the driving circuit.

DETAILED DESCRIPTION

Figure 1:
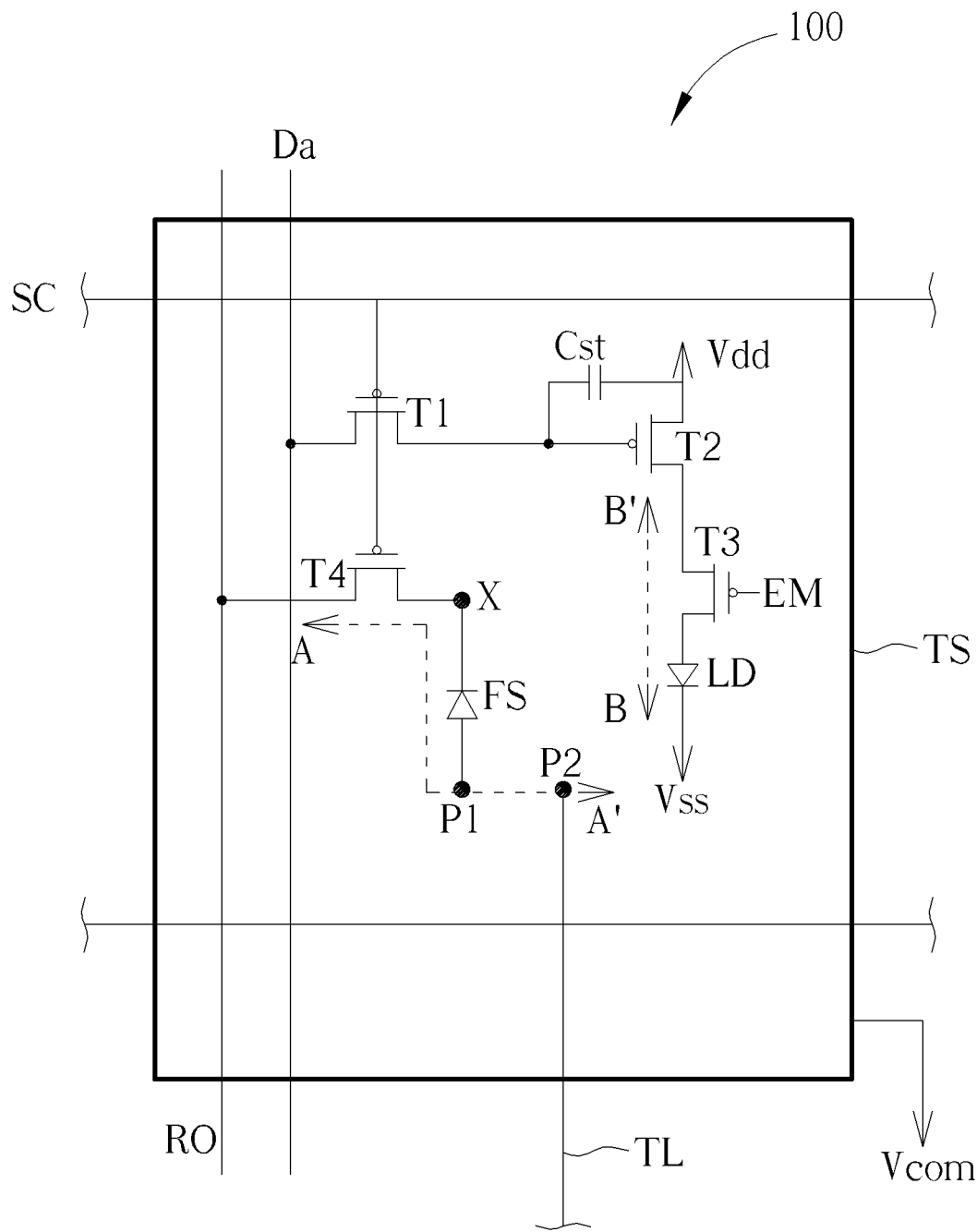
FIG. 1 is a schematic diagram showing a circuit of an electronic device according to some embodiments of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When the corresponding component such as layer or region is referred to "on another component (or the variant thereof)", it may be directly on this another component, or other component(s) may exist between them. On the other hand, when the component is referred to "directly on another component (or the variant thereof)", any component does not exist between them.

It will be understood that when a component or layer is referred to as being "connected to" another component or layer, it can be directly connected to this another component or layer, or intervening components or layers may be presented. When a component is referred to as being "directly connected to" another component or layer, there are no intervening components or layers presented. In addition, when the component is referred to "be coupled to/with another component (or the variant thereof)", it may be directly connected to this another component, or may be indirectly connected (such as electrically connected) to this another component through other component(s).

The terms "about" or "substantially" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the present disclosure, the electronic device may be any suitable type. For example, the electronic device may be a touch display device, an antenna device, a tiled device, a sensing device or a flexible device, etc., but not limited thereto. The electronic device of the present disclosure may be a touch display device having a fingerprint identifying function, and the display device may include liquid crystal (LC) molecules, an organic light-emitting diode (OLED), an inorganic light-emitting diode (LED) such as a micro-LED and/or a mini-LED, quantum dots (QDs) material, a quantum-dot light-emitting diode (QLED, QDLED), fluorescence material, phosphor material, other suitable material or a combination thereof, but not limited thereto. The tiled device may be such as a tiled display device or a tiled antenna device, but not limited thereto. In the following, in order to explain exemplarily, the display device in the electronic device is a micro-LED display device or a mini-LED display device. Furthermore, the display device in the electronic device may be a color display device or a monochrome display device, and a shape of the electronic device may be a rectangle, a circle, a polygon, a shape having a curved edge or other suitable shape. Moreover, for instance, the electronic device described below performs the touch sensing function through a self-capacitance touch sensing, but the touch sensing method is not limited thereto. Any suitable touch sensing method can be used based on requirement(s). In another embodiment, a touch sensing component and a fingerprint sensor may be externally attached to the display device, so as to form an out-cell touch display device.

Since the electronic device of some embodiments in the present disclosure has a function of displaying an image, the electronic device may include a plurality of sub-pixels arranged alongside. In some embodiments of the present disclosure, the display device in the electronic device may be a color display device. The sub-pixels may include green sub-pixels, red sub-pixels and blue sub-pixels, or the sub-pixels may include green sub-pixels, red sub-pixels, blue sub-pixels and yellow sub-pixels, or the sub-pixels may include green sub-pixels, red sub-pixels, blue sub-pixels and white sub-pixels, such that the color image may be displayed by different color lights generated by the sub-pixels, but not limited thereto. The colors of the lights provided by the sub-pixels may be designed based on requirement(s). In some embodiments of the present disclosure, the display device in the electronic device may be may be a monochrome display device, and all sub-pixels may emit the lights with the same color, such as white, red or any suitable color. In addition, a top-view shape of the sub-pixels may be a rectangle, a parallelogram, a ">" shape or any suitable shape.

Figure 2:
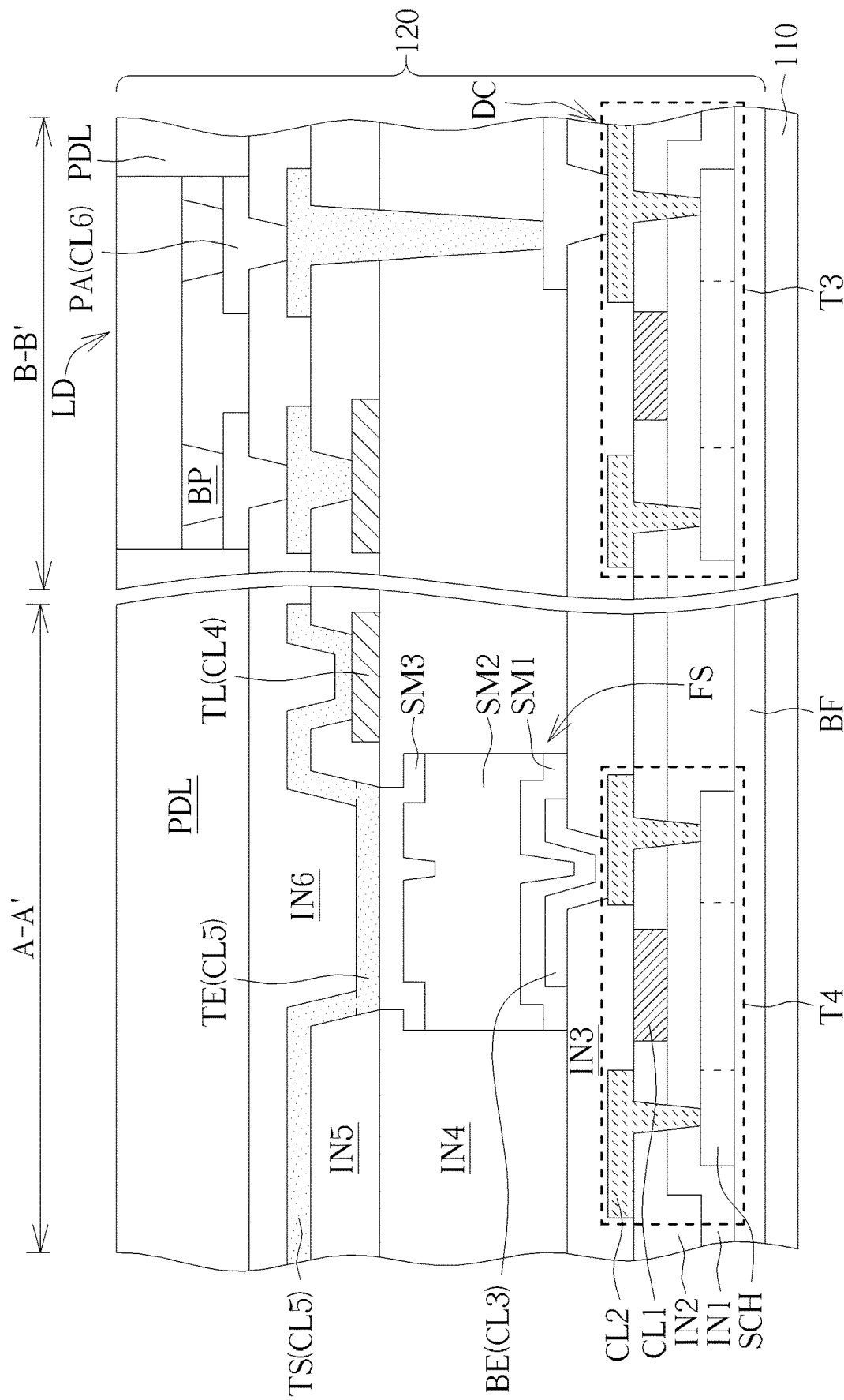
FIG. 2 is a schematic diagram showing a cross-sectional view of a structure taken along a cross-sectional line A-A' and a cross-sectional line B-B' in FIG. 1.

Referring to FIG. 1 and FIG. 2, FIG. 1 is a schematic diagram showing a circuit of an electronic device according to some embodiments of the present disclosure, and FIG. 2 is a schematic diagram showing a cross-sectional view of a structure taken along a cross-sectional line A-A' and a cross-sectional line B-B' in FIG. 1, wherein FIG. 1 only shows a circuit in one sub-pixel of the electronic device 100. Note that the circuit shown in FIG. 1 is an example, and the design of the circuit may be adjusted based on requirement(s). As shown in FIG. 1 and FIG. 2, the electronic device 100 of some embodiments of the present disclosure includes a substrate 110, a driving circuit DC and at least one fingerprint sensor FS, and the electronic device 100 may optionally include at least one touch signal line TL, at least one touch electrode (i.e., at least one transparent electrode) TS and at least one light emitting unit LD. The material of the substrate 110 may include glass, quartz, sapphire, polymer (e.g., polyimide (PI) and/or polyethylene terephthalate (PET)) and/or other suitable material, so as to be a flexible substrate or a hard substrate, but not limited thereto.

In some embodiments of the present disclosure, the driving circuit DC, the fingerprint sensor FS, the touch signal line TL, the touch electrode TS and the light emitting unit LD are disposed on the substrate 110, and the connections of these structures are shown in FIG. 1 in detail. In FIG. 1, the driving circuit DC may include a plurality of switching components, a plurality of signal lines (e.g., data lines Da, scan lines SC, readout signal lines RO) and other needed electronic component (e.g., capacitors Cst). The switching component may be such as a thin film transistor, and each switching component may be a P-type thin film transistor or a N-type thin film transistor and/or the switching components may be a combination of the N-type thin film transistor(s) and the P-type thin film transistor(s) based on requirement(s) of the circuit design, but not limited thereto. Also, the electronic device 100 may further include a display control circuit (not shown in figures), a fingerprint identifying control circuit (not shown in figures) and a touch sensing control circuit (not shown in figures). The display control circuit may be electrically connected to the data lines Da and the scan lines SC in the driving circuit DC, and the display control circuit may provide display gray level signals to the light emitting units LD through the data lines Da, the scan lines SC and the switching components, such that the light emitting units LD may emit the lights with corresponding intensities, thereby controlling the display image. The fingerprint identifying control circuit is electrically connected to the readout signal lines RO in the driving circuit DC, and the fingerprint identifying control circuit obtains fingerprint sensing signals through the readout signal lines RO, the switching components and the fingerprint sensors FS, so as to identify the fingerprint. The touch sensing control circuit is electrically connected to the touch electrodes TS through the touch signal lines TL, so as to obtain touch signals generated by the touch electrodes TS, thereby performing the touch sensing function. In addition, the dispositions of the display control circuit, the fingerprint identifying control circuit and the touch sensing control circuit may be designed based on requirement(s). In some embodiments of the present disclosure, the display control circuit, the fingerprint identifying control circuit and the touch sensing control circuit may be different circuit chips respectively, but not limited thereto. In some embodiments, the display control circuit, the fingerprint identifying control circuit and the touch sensing control circuit are integrated in one control circuit chip.

As shown in FIG. 1, in the switching components of the driving circuit DC, the switching components may include a first switching component T1, a second switching component T2, a third switching component T3 and a fourth switching component T4 corresponding to the same sub-pixel. The electrical connections of the display control circuit, the data lines Da, the scan lines SC, the first switching component T1, the second switching component T2, the third switching component T3, the capacitor Cst and the light emitting unit LD may control the display image. The electrical connections of the fingerprint identifying control circuit, the readout signal line RO, the fourth switching component T4 and the fingerprint sensor FS may be configured to obtain the fingerprint sensing signal, thereby identifying the fingerprint. In some embodiments of the present disclosure, the first switching component T1, the second switching component T2, the third switching component T3 and the fourth switching component T4 may be the P-type thin film transistors, but not limited thereto. The switching components may be changed based on requirement(s) of the circuit design. The light emitting unit LD may be any suitable light emitting component, and the light emitting unit LD may be adjusted based on the type of the display device in the electronic device 100. For instance, the light emitting unit LD may be an OLED, a micro-LED, a mini-LED, a QLED or other suitable light emitting component. In some embodiments of the present disclosure, the light emitting unit LD may be a micro-LED or a mini-LED, such that the display device of the electronic device 100 is a micro-LED display device or mini-LED display device.

In the present disclosure, the fingerprint sensor FS may use any suitable method to sense the fingerprint. In some embodiments of the present disclosure, the fingerprint sensor FS may include a photo sensor (such as a thin film transistor, a PN junction diode, a PIN diode or other suitable photoelectric conversion component) to detect the intensity of the reflective light reflected from the finger, such that the fingerprint identifying control circuit may obtain the minutiae of the fingerprint, thereby identifying the fingerprint. In some embodiments of the present disclosure, the photo sensor of the fingerprint sensor FS is a PIN diode for example. Moreover, each fingerprint sensor FS may be disposed in one of the sub-pixels, but the position of the fingerprint sensor FS and the density of fingerprint sensor(s) FS may be designed based on requirement(s). In some embodiments of the present disclosure, each sub-pixel may have one fingerprint sensor FS, but not limited thereto. In some embodiments, each sub-pixel situated in a specific region may have one fingerprint sensor FS, and each sub-pixel situated at other position may not have the fingerprint sensor FS, but not limited thereto. In some embodiments, it is not require the fingerprint sensors FS to be disposed in every sub-pixel. For example, only one sub-pixel among three successive sub-pixels has one fingerprint sensor FS. In other words, the density of the fingerprint sensor(s) FS may be less than the density of the sub-pixels, but not limited thereto.

As shown in FIG. 1 and FIG. 2, the electronic device 100 may include a circuit component layer 120 disposed on the substrate 110, and the driving circuit DC, the fingerprint sensor FS, the data line Da, the scan line SC, the readout signal line RO, the touch signal line TL, the touch electrode TS and the light emitting unit LD are disposed in the circuit component layer 120. Specifically, the circuit component layer 120 may include at least one conductive layer, at least one insulating layer, at least one semiconductor layer and/or other needed layer(s), so as to form the needed circuit and/or the needed electronic component. For example, the material of the conductive layer may include metal, transparent conductive material (such as indium tin oxide (ITO), indium zinc oxide (IZO), etc.), other suitable conductive material or a combination thereof, but not limited thereto. The material of the insulating layer may include silicon oxide, silicon nitride, silicon oxynitride, other suitable insulating material or a combination thereof, but not limited thereto. The semiconductor layer may include polycrystalline silicon, amorphous silicon, metal-oxide semiconductor, other suitable semiconductor material or a combination thereof, but not limited thereto.

In detail, in FIG. 2, the circuit component layer 120 may include a semiconductor channel layer SCH, a first conductive layer CL1, a second conductive layer CL2, a third conductive layer CL3, a fourth conductive layer CL4, a fifth conductive layer CL5 and a sixth conductive layer CL6, and the circuit component layer 120 may further include an insulating layer IN1, an insulating layer IN2, an insulating layer IN3, an insulating layer IN4, an insulating layer IN5 and an insulating layer IN6 to make at least portion of the semiconductor channel layer SCH, at least portion of the first conductive layer CL1, at least portion of the second conductive layer CL2, at least portion of the third conductive layer CL3, at least portion of the fourth conductive layer CL4, at least portion of the fifth conductive layer CL5 and at least portion of the sixth conductive layer CL6 be separated by each other. In some embodiments of the present disclosure, the first conductive layer CL1, the second conductive layer CL2, the third conductive layer CL3, the fourth conductive layer CL4 and the sixth conductive layer CL6 are metal conductive layers, the fifth conductive layer CL5 is a transparent conductive layer, but not limited thereto. The semiconductor channel layer SCH may include a semiconductor channel of each switching component, the first conductive layer CL1 may include the scan lines SC and/or a gate of each switching component, and the second conductive layer CL2 may include the data lines Da and/or a source and a drain of each switching component. Note that, in some embodiments of the present disclosure, since the insulating layer IN1 is between the gate of the switching component and the semiconductor channel, the insulating layer IN1 may serve as a gate insulator in the switching component. In addition, the capacitor Cst in the driving circuit DC may be formed of the conductive layer(s) and the insulating layer(s) in the circuit component layer 120; the readout signal line RO may be formed of one metal conductive layer in the circuit component layer 120, and the readout signal line RO may be electrically connected to the fourth switching component T4 directly or be electrically connected to a terminal of the fourth switching component T4 through a connecting structure. The fingerprint sensor FS may be electrically connected to the fourth switching component T4 directly or be electrically connected to the fourth switching component T4 through a connecting structure.

In FIG. 2, the fingerprint sensor FS is disposed on the fourth switching component T4, the PIN diode of the fingerprint sensor FS includes a first semiconductor layer SM1, a second semiconductor layer SM2 and a third semiconductor layer SM3, and the second semiconductor layer SM2 is disposed between the first semiconductor layer SM1 and the third semiconductor layer SM3, wherein the first semiconductor layer SM1 may be an N-type semiconductor layer, the second semiconductor layer SM2 may be an intrinsic semiconductor layer, and the third semiconductor layer SM3 may be a P-type semiconductor layer. The first semiconductor layer SM1, the second semiconductor layer SM2 and the third semiconductor layer SM3 may include amorphous silicon, polycrystalline silicon, metal-oxide semiconductor, other suitable semiconductor material or a combination thereof, but not limited thereto. The material of the first semiconductor layer SM1, the material of the second semiconductor layer SM2 and the material of the third semiconductor layer SM3 may have the same or different, but not limited thereto. Furthermore, the fingerprint sensor FS further includes a first electrode BE and a second electrode TE in the PIN diode, wherein the first electrode BE may be formed of the third conductive layer CL3 and electrically connected to a terminal of the fourth switching component T4 of the driving circuit DC, the second electrode TE may be formed of the fifth conductive layer CL5, but not limited thereto. In addition, the insulating layer IN4 may serve as a flattening layer, so as to flatten a surface after the fingerprint sensor FS is disposed.

In some embodiments of the present disclosure, the touch electrode TS may be formed of the fifth conductive layer CL5 containing the transparent conductive material, and the touch electrode TS is situated on the insulating layer IN4 and/or the insulating layer IN5. That is to say, the second electrode TE of the fingerprint sensor FS and the touch electrode TS may be formed by the same manufacturing process. As shown in FIG. 1 and FIG. 2, the touch electrode TS may be electrically connected to the second electrode TE of the fingerprint sensor FS (e.g., they are electrically connected to each other at a position P1 in FIG. 1), and the second electrode TE of the fingerprint sensor FS and the touch electrode TS may be electrically connected to the same voltage source, such as a common voltage (Vcom), but not limited thereto. In some embodiments of the present disclosure, the touch electrode TS may correspond to one or more the sub-pixel(s), and the touch electrode TS may correspond to the circuit component layer 120 in the sub-pixel(s). In some embodiments of the present disclosure, the touch signal line TL may be formed of one metal conductive layer in the circuit component layer 120; for example, the touch signal line TL in FIG. 2 may be formed of the fourth conductive layer CL4. The touch signal line TL is electrically connected to the touch electrode TS (e.g., they are electrically connected to each other at a position P2 in FIG. 1), and the touch signal line TL is electrically connected to the second electrode TE of the fingerprint sensor FS through the touch electrode TS. In other words, the touch sensing control circuit may be electrically connected to the second electrode TE of the fingerprint sensor FS through the touch signal line TL and the touch electrode TS.

As shown in FIG. 1 and FIG. 2, the light emitting unit LD is connected to the third switching component T3. In some embodiments of the present disclosure, at least one bonding part BP of the light emitting unit LD is bonded to at least one bonding pad PA of the sixth conductive layer CL6, so as to be electrically connected to each other, but the forming method and the position of the light emitting unit LD are not limited thereto. The forming method and the position of the light emitting unit LD may be adjusted based on the type of the light emitting unit LD and/or requirement(s) of the circuit design. In another embodiment, for instance, when the light emitting unit LD is an OLED, each layer of the light emitting unit LD may be formed in the circuit component layer 120 by such as a deposition process and a photolithography process, and the position of the light emitting unit LD may be adjusted based on requirement(s). The light emitting unit LD of some embodiments of the present disclosure may be a flip chip type as an example, but not limited thereto. In some embodiments, the light emitting unit LD may be a vertical type, and the circuit component layer 120 further includes a conductive layer disposed on the light emitting unit LD for being electrically connected to an electrode of the light emitting unit LD. Moreover, in some embodiments of the present disclosure, the light emitting unit LD and the touch electrode TS may be integrated in the circuit component layer 120 on the substrate 110, and therefore, the electronic device 100 of some embodiments of the present disclosure may be an in-cell touch display device, but not limited thereto. The fingerprint sensor FS of some embodiments of the present disclosure may be integrated in the circuit component layer 120 on the substrate 110. In some embodiments of the present disclosure, the fingerprint sensor FS, the light emitting unit LD and the touch electrode TS may be integrated in the circuit component layer 120 on the substrate 110.

The circuit component layer 120 may optionally include other needed layer(s) and/or structure(s). In some embodiments of the present disclosure, the circuit component layer 120 may further include a pixel defining layer PDL configured to separate two adjacent light emitting units LD from each other and/or two adjacent sub-pixels from each other according to a normal direction of the substrate 110 (in top view). In FIG. 2, the pixel defining layer PDL is adjacent to the light emitting unit LD and disposed on the touch electrode TS and the fingerprint sensor FS, but not limited thereto. In some embodiments, the circuit component layer 120 may further include a buffer layer BF disposed between the semiconductor channel layer SCH and the substrate 110, so as to advantage the formation and disposition of the semiconductor channel layer SCH.

The circuit chip(s) such as the display control circuit, the fingerprint identifying control circuit and/or the touch sensing control circuit may be disposed on the circuit component layer 120 by a bonding process, and the circuit chip(s) may be electrically connected to the electronic component(s) in the circuit component layer 120, but not limited thereto. In some embodiments, the display control circuit, the fingerprint identifying control circuit and/or the touch sensing control circuit may be directly formed in the circuit component layer 120 by a deposition process, a photolithography process and an etching process. Moreover, the disposition of each layer in the circuit component layer 120 and the layer(s) used in the electronic component may be adjusted based on requirement(s), and they are not limited to the above.

The electronic device 100 may further include other needed layer(s) and/or structure(s) based on the type of the electronic device 100. For example, the electronic device 100 may include an optical layer (e.g., a polarizer), a light-shielding layer, a light color converting layer (containing such as color filter and/or quantum dots material), a medium layer (e.g., a liquid crystal layer) and/or a backlight layer, and they may be disposed at suitable positions based on requirement(s).

Figure 3:
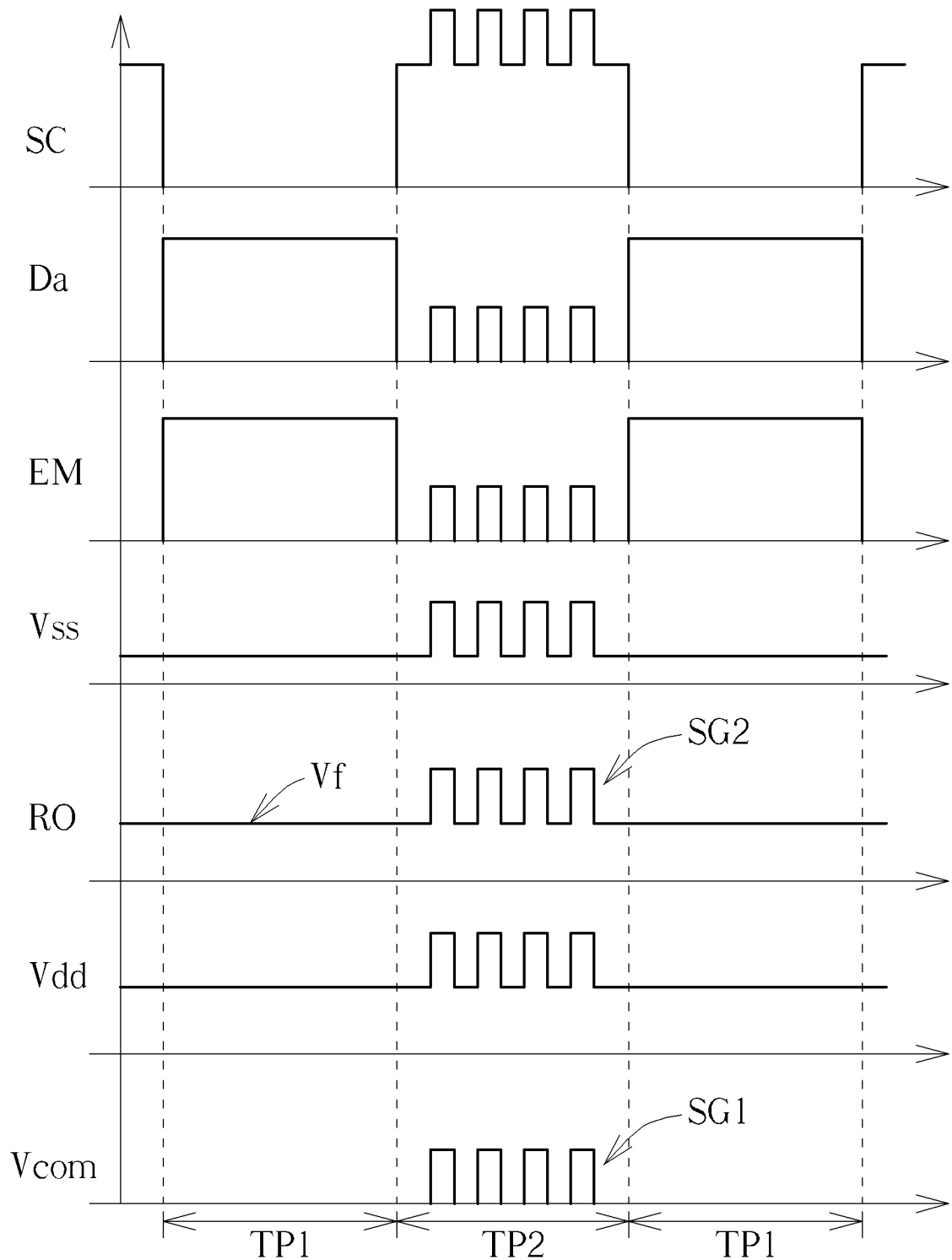
FIG. 3 is a timing diagram of a circuit of an electronic device according to some embodiments of the present disclosure.

For example, the circuit of the electronic device of some embodiments of the present disclosure uses the timing diagram shown in FIG. 3. Note that the profile of the circuit signal may be any suitable type. In FIG. 3, the circuit signal is a square wave as an example, but not limited thereto. In addition, although the square wave shown in FIG. 3 is an ideal square wave, the square wave provided in actuality may be a non-ideal square wave having a noise signal, a ripple effect and/or a ringing effect. In FIG. 3, the amplitude of the circuit signal is exemplary, the relations of the amplitudes of the circuit signals are not limited to FIG. 3, and FIG. 3 does not show the fingerprint sensing signal and the touch sensing signal sensed by the fingerprint sensor FS and the touch electrode TS respectively. As shown in FIG. 1 and FIG. 3, in some embodiments of the present disclosure, the electronic device 100 has a touch sensing mode and a fingerprint sensing mode, and the electronic device 100 also has the image display function, wherein the touch sensing function, the fingerprint sensing function and the image display function are integrated in the same circuit. The following explanation will be taken in conjunction with the timing diagram shown in FIG. 3. Note that, in FIG. 3, the operation of the electronic device 100 may be divided into a first timing TP1 and a second timing TP2 which are alternated.

For example, in some embodiments of the present disclosure shown in FIG. 1 and FIG. 3, regarding displaying the image, in the first timing TP1, the scan line SC may provide a turn-on signal (e.g., a lower voltage) to turn on the first switching component T1, a voltage source EM may provide a turn-off signal (e.g., a higher voltage) to turn off the third switching component T3, and thus, the signal provided from the display control circuit may be stored in the capacitor Cst through the data line Da and the first switching component T1. Then, in the second timing TP2, the scan line SC may provide a turn-off signal (e.g., a higher voltage) to turn off the first switching component T1, and the voltage source EM may provide a turn-on signal (e.g., a lower voltage) to turn on the third switching component T3, such that a current may flow from a voltage source Vdd to the light emitting unit LD through the second switching component T2 and the third switching component T3, and the light emitting unit LD may emit the light with corresponding intensity based on the signal stored in the capacitor Cst, thereby displaying the image.

For example, in some embodiments of the present disclosure shown in FIG. 1 and FIG. 3, regarding sensing the fingerprint, in the first timing TP1, the scan line SC provides the turn-on signal to turn on the first switching component T1 and the fourth switching component T4, and a voltage source Vcom may provide such as a ground voltage. In some embodiments of the present disclosure, since the fingerprint identifying control circuit may provide a specific voltage Vx at a node X (i.e., the node X is charged to the specific voltage Vx), and the specific voltage Vx and the ground voltage provided from the voltage source Vcom may provide a reverse bias for the fingerprint sensor FS, the fingerprint identifying control circuit may charge the fingerprint sensor FS to the specific voltage Vx through the readout signal line RO. Then, in the second timing TP2, the scan line SC may turn off the first switching component T1 and the fourth switching component T4, and the light emitting unit LD may emit the light. Therefore, the finger may reflect the light emitted from the light emitting unit LD, and the fingerprint sensor FS may generate a corresponding current based on the intensity of the reflective light reflected from the finger, such that the specific voltage Vx at the node X may be changed. Particularly, since the intensity of the reflective light reflected from the finger is changed based on the fingerprint profile of the finger (e.g., an intensity of a reflective light reflected from a fingerprint ridge may be greater than an intensity of a reflective light reflected from a fingerprint valley), and the fingerprint sensor FS may generate different currents based on different intensities of the reflective lights, the change amplitude of the voltage value at the node X may correspond to the fingerprint profile of the corresponding region of the finger. Then, in the next first timing TP1, the fourth switching component T4 is turned on again, such that the fingerprint identifying control circuit may charge the fingerprint sensor FS through the readout signal line RO, such that the voltage value at the node X may be recovered to the specific voltage Vx. Furthermore, in this timing, the fingerprint identifying control circuit may detect a charge quantity charging to the node X at the same time, so as to know the change amplitude of the voltage value at the node X, thereby obtaining the fingerprint profile of this region. Finally, the fingerprint identifying control circuit identifies the fingerprint according to the result of all fingerprint sensor(s) FS. As the result, in the fingerprint sensing mode, the fingerprint sensor FS senses the intensity of the reflective light reflected from the finger to obtain the fingerprint signal in the second timing TP2, and the fingerprint signal from the fingerprint sensor FS is read in the first timing TP1.

For example, in some embodiments of the present disclosure shown in FIG. 1 and FIG. 3, the touch sensing function is performed in the second timing TP2. When the touch sensing function is performed, the touch sensing control circuit may control the voltage source Vcom to provide at least one first signal SG1 to the touch electrode TS. Because the touch electrode TS is electrically connected to the touch signal line TL, the first signal SG1 may also be provided to the touch signal line TL. When the user touches the electronic device 100, a signal may be transmitted back to the touch sensing control circuit from the touch electrode TS through the touch signal line TL, and the touch sensing control circuit may obtain the position touched by the user based on a difference between the signal transmitted back from the touch signal line TL and the first signal SG1, thereby sensing the touch. Particularly, since the touch electrode TS corresponds to the circuit component layer 120 in the sub-pixel(s), when the touch electrode TS receives the first signal SG1, a loading of an electronic component may be changed owing to a change of a voltage difference between this electronic component and the touch electrode TS, so as to cause an unwanted coupling between this electronic component and the touch electrode TS. In order to reduce the above situation, in some embodiments of the present disclosure, the voltage source Vdd, the voltage source Vss, the voltage source EM and/or the signal source (e.g., the display control circuit, the fingerprint identifying control circuit) may synchronously provide a signal corresponding to the first signal SG1 to the electrically connected electronic component (e.g., the display control circuit provides this signal to the scan line SC and the data line Da, the fingerprint identifying control circuit provides this signal to the readout signal line RO) while the touch sensing control circuit provides the first signal SG1, wherein this signal is superimposed on the original voltage provided by the voltage source and/or the signal source. For instance, the fingerprint identifying control circuit may provide a second signal SG2 to the readout signal line RO, the second signal SG2 may be superimposed on the original voltage Vf provided from the fingerprint identifying control circuit, and the first signal SG1 and the second signal SG2 are synchronized. For instance, the display control circuit may provide a third signal to the data line Da and provide a fourth signal to the scan line SC, the third signal and the fourth signal may be respectively superimposed on the original voltage of the data line Da and the original voltage of the scan line SC, and the first signal SG1, the third signal and the fourth signal are synchronized. Accordingly, based on the above design, the voltage difference between the electronic component and the touch electrode TS may be maintained, so as to decrease the influence of the circuit caused by the loading and the coupling, thereby enhancing the reliabilities of the touch sensing function, the display function and the fingerprint identifying function. Note that, in the above, "two signals are synchronized" represents that, not only the providing time of two signals are the same, but also of two signals are have the same waveform and the same amplitude, wherein when an error between the times, an error between periods, an error between waveforms and an error between amplitudes of the two signals are less than 10%, 5%, 3%, 2%, 1%, or 0.5%, the two signals are regarded as "same".

Moreover, in some embodiments of the present disclosure, because the touch sensing mode is performed in the second timing TP2, under the condition of performing the touch sensing mode, the light emitting unit LD may emit the light, but not limited thereto. In some embodiments, the timing of the touch sensing mode may not overlap the timing which the light emitting unit LD emits the light. Moreover, in some embodiments of the present disclosure, since the touch electrode TS is electrically connected to the second electrode TE of the fingerprint sensor FS, in order to decrease the impact on the fingerprint sensing due to the touch sensing mode, the fourth switching component T4 electrically connected to the first electrode BE of the fingerprint sensor FS is in a turn-off status at the touch sensing mode, such that the impact caused by the touch sensing signal on the fingerprint sensing signal received by the fingerprint identifying control circuit is reduced, thereby increasing the reliability of the fingerprint identifying function. In addition, the first signal SG1 provided by the touch sensing control circuit should not be too greater, so as to prevent the diode of the fingerprint sensor FS from being turned on, thereby reducing the disadvantaging impact on the accuracy of the fingerprint sensing.

In some embodiments of the present disclosure, the fingerprint sensor FS may be integrated in the sub-pixel. That is to say, in some embodiments of the present disclosure, the fingerprint sensing function and the touch sensing function are performed in a display region. Thus, in this design, it is convenient for the user to use the touch sensing function and the fingerprint sensing function of the electronic device 100. In addition, the circuit design is not limited to the above, and the circuit design maybe adjusted based on requirement(s).

In some embodiments of the present disclosure, the electronic device may be an out-cell touch display device. In detail, in some embodiments of the present disclosure, the substrate 110 and the circuit component layer 120 described above may be externally attached to the display device, but the circuit component layer 120 may not include the light emitting unit LD configured to display the image and the electronic component corresponding to the light emitting unit LD (e.g., the first switching component T1, the second switching component T2, the third switching component T3, the data line Da and the display control circuit, etc.). Therefore, in the timing diagram of FIG. 3, the supply of the signals of the data line Da, the voltage source EM, the voltage source Vss and the voltage source Vdd may be omitted, and the image display function may be provided by the display device. Moreover, the display device of the electronic device of some embodiments of the present disclosure may be any suitable type. For instance, the display device may be a liquid crystal display device, an OLED display device, a micro-LED display device, a mini-LED display device or a QLED display device, but not limited thereto. Note that, although the touch electrode TS and the fingerprint sensor FS are externally attached to the display device, the position of the touch electrode TS and the position of the fingerprint sensor FS may be still corresponding to (e.g., overlapped with) the display region of the display device.

In another embodiment, the electronic device may not have the image display function; for example, the electronic device may be an antenna device (e.g., a liquid crystal antenna device). Thus, the circuit component layer 120 described above does not include the light emitting unit LD configured to display the image and the electronic component corresponding to the light emitting unit LD. Also, in the timing diagram of FIG. 3, the supply of the signals of the data line Da, the voltage source EM, the voltage source Vss and the voltage source Vdd may be omitted.

The electronic device of some embodiments of the present disclosure is not limited to the above embodiments. Further embodiments of the present disclosure are described below. In order to simplify the explanation and highlight the differences between the embodiments, the same components will be labeled with the same symbol in the following, and the repeated parts will not be redundantly described.

Figure 4:
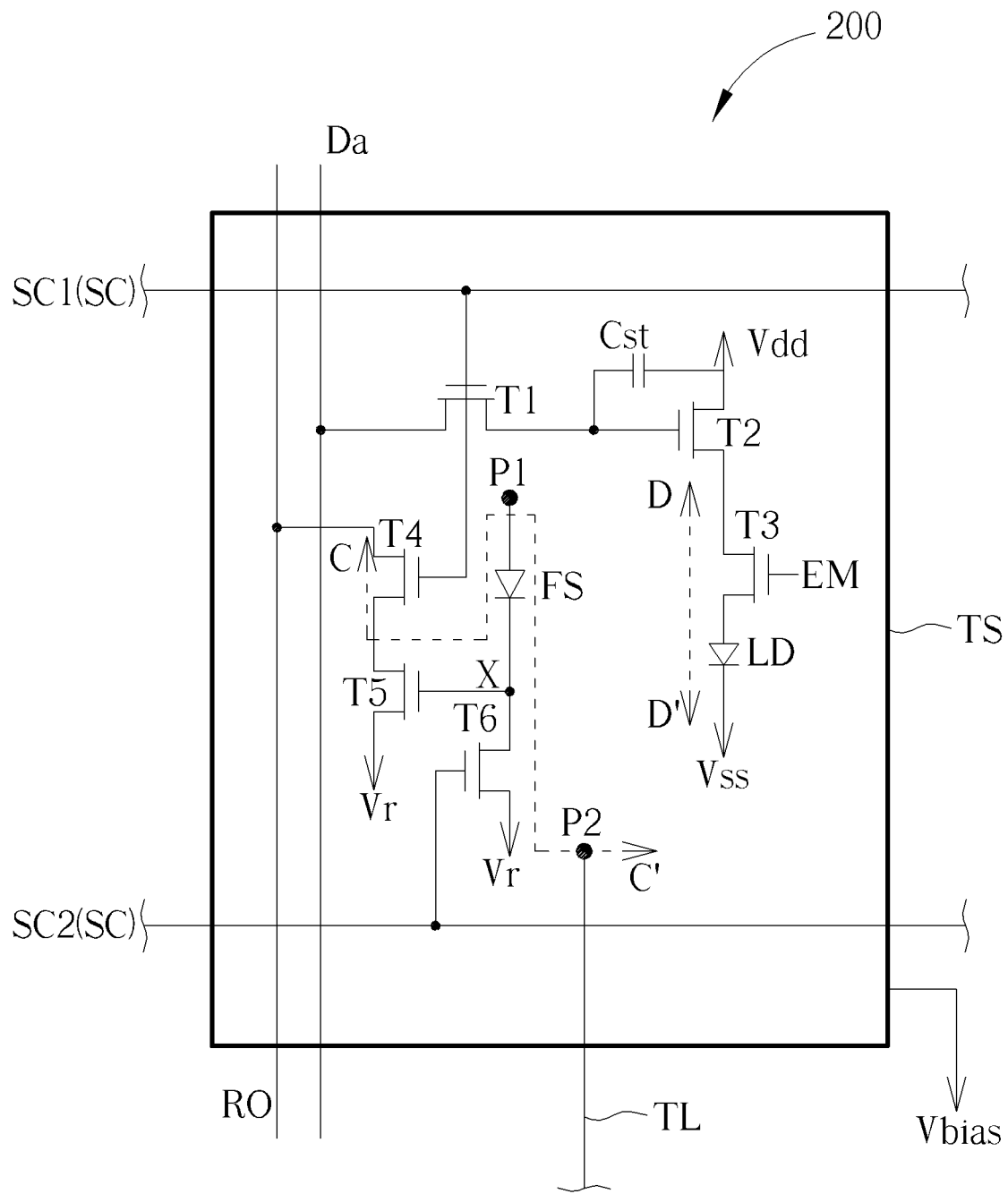
FIG. 4 is a schematic diagram showing a circuit of an electronic device according to some embodiments of the present disclosure.
Figure 5:
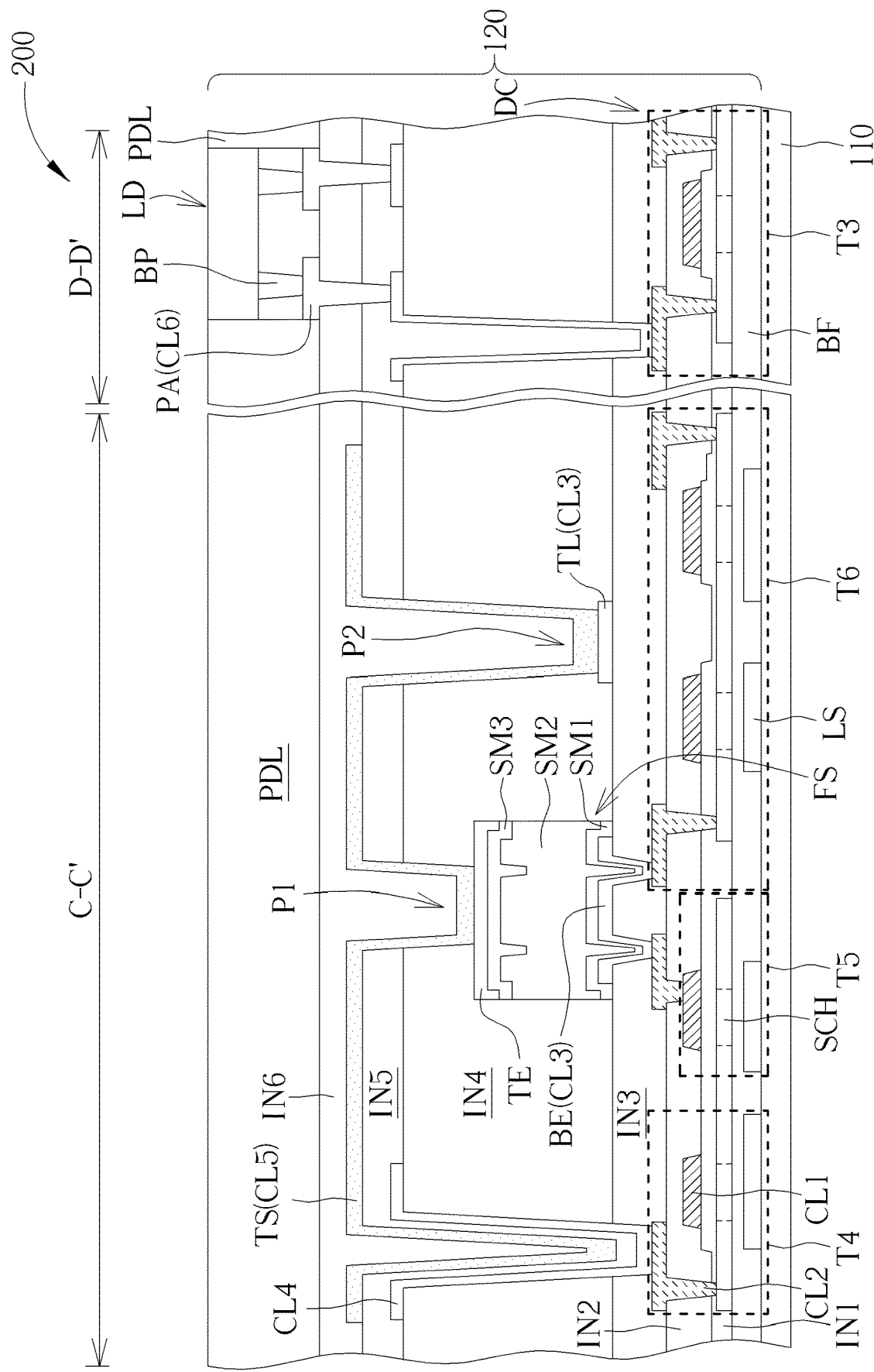
FIG. 5 is a schematic diagram showing a cross-sectional view of a structure taken along a cross-sectional line C-C' and a cross-sectional line D-D' in FIG. 4.

Referring to FIG. 4 and FIG. 5, FIG. 4 is a schematic diagram showing a circuit of an electronic device according to some embodiments of the present disclosure, and FIG. 5 is a schematic diagram showing a cross-sectional view of a structure taken along a cross-sectional line C-C' and a cross-sectional line D-D' in FIG. 4, wherein FIG. 4 only shows a circuit in one sub-pixel of the electronic device 200. As shown in FIG. 4, a difference between the electronic device 200 of this embodiment and the above embodiment is the design of the fingerprint sensing circuit. Specifically, in the driving circuit DC, the switching components may further include a fifth switching component T5 and a sixth switching component T6 corresponding to the same sub-pixel. The electrical connections of the fingerprint identifying control circuit, the readout signal line RO, the fourth switching component T4, the fifth switching component T5, the sixth switching component T6 and the fingerprint sensor FS may be configured to obtain the fingerprint sensing signal, so as to identify the fingerprint. Moreover, in FIG. 4, the scan lines SC may include a first scan line SC1 and a second scan line SC2, the first scan line SC1 is electrically connected to the gate of the first switching component T1 and the gate of the fourth switching component T4, and the second scan line SC2 is electrically connected to the gate of the sixth switching component T6. Furthermore, in FIG. 4 and FIG. 5, the second electrode TE of the fingerprint sensor FS and the touch electrode TS are electrically connected to each other at a position P1, the touch electrode TS and the touch signal line TL are electrically connected to each other at a position P2, and the touch electrode TS is electrically connected to a voltage source Vbias.

Figure 6:
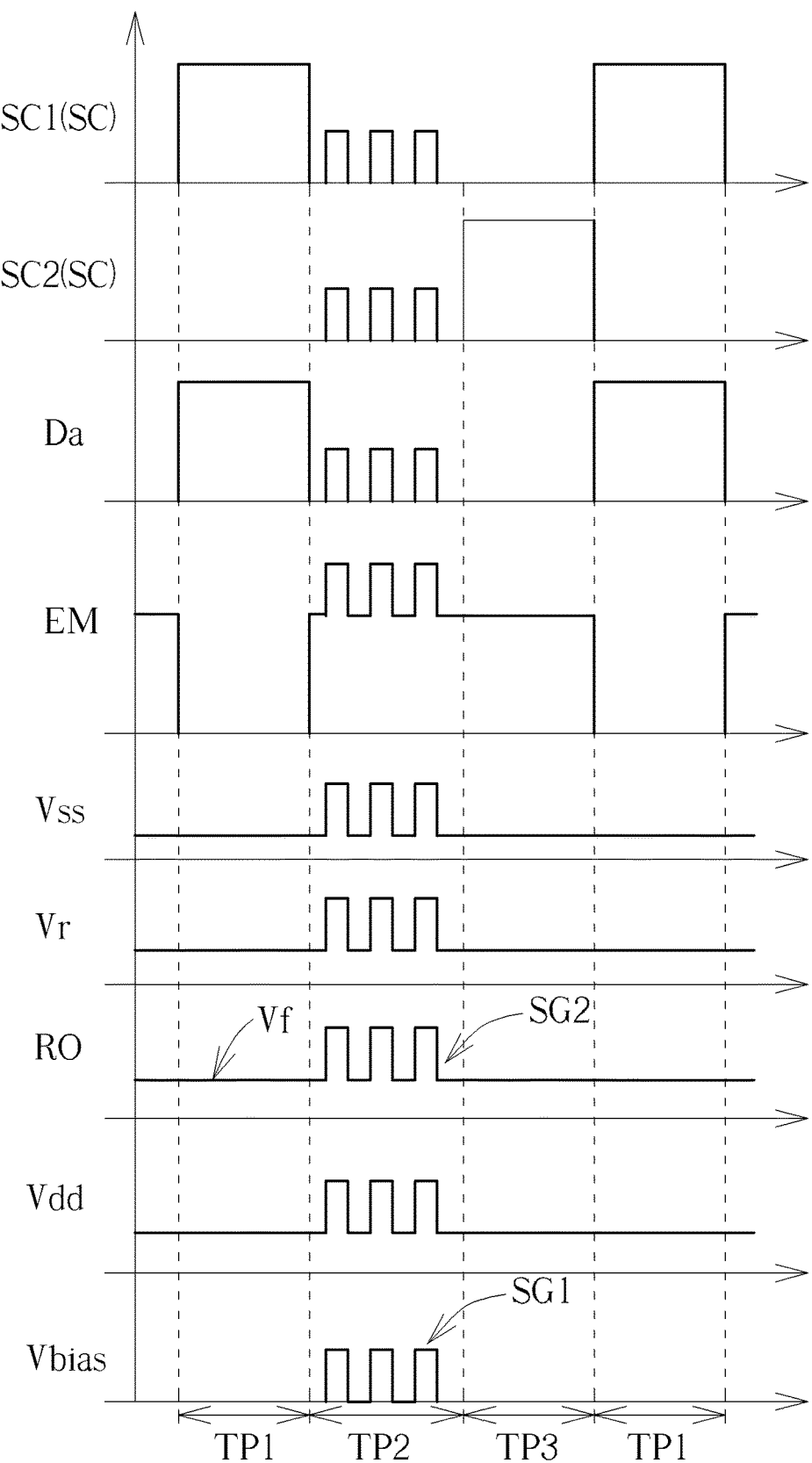
FIG. 6 is a timing diagram of a circuit of an electronic device according to some embodiments of the present disclosure.

Referring to FIG. 4 and FIG. 6, FIG. 6 is a timing diagram of a circuit of an electronic device according to some embodiments of the present disclosure. Note that the profile of the circuit signal may be any suitable type. In FIG. 6, the circuit signal is a square wave as an example, but not limited thereto. In addition, although the square wave shown in FIG. 6 is an ideal square wave, the square wave provided in actuality may be a non-ideal square wave having a noise signal, a ripple effect and/or a ringing effect. In FIG. 6, the amplitude of the circuit signal is exemplary, the relations of the amplitudes of the circuit signals are not limited to FIG. 6, and FIG. 6 does not show the fingerprint sensing signal and the touch sensing signal sensed by the fingerprint sensor FS and the touch electrode TS respectively. Note that, since the switching component T1, the switching component T2, the switching component T3, the switching component T4, the switching component T5 and the switching component T6 shown in FIG. 4 are N-type thin film transistors, compared with FIG. 1 (the switching component T1, the switching component T2, the switching component T3 and the switching component T4 are P-type thin film transistor), the relation of the switching signals of the gates (i.e., the signal provided to the scan line SC by the display control circuit and the signal provided by the voltage source EM) in FIG. 4 and FIG. 6 and the relation of the switching signals of the gates in FIG. 1 and FIG. 3 may be opposite, but the types of the switching components are not limited thereto. In FIG. 4 and FIG. 6, the operation of the electronic device 200 may be divided into the first timing TP1, the second timing TP2 and a third timing TP3 which are alternated, wherein the display control circuit may charge the capacitor Cst in the first timing TP1, the light emitting unit LD may emit the light in the second timing TP2 and the third timing TP3. The driving method of displaying the image is substantially similar to FIG. 3 and the above embodiment, and therefore, this content will not be redundantly described. In FIG. 4 and FIG. 6, the touch sensing function may be performed in the second timing TP2, wherein the first signal SG1 may be provided from the touch sensing control circuit through the voltage source Vbias to the touch electrode TS. The driving method of the touch sensing is substantially similar to FIG. 3 and the above embodiment, and therefore, this content will not be redundantly described.

Regarding the fingerprint sensing function, as shown in FIG. 4 and FIG. 6, in the third timing TP3, the second scan line SC2 may provide the turn-on signal to turn on the sixth switching component T6, and the voltage source Vr and a voltage of the voltage source Vbias may a reverse bias for the fingerprint sensor FS. Therefore, the node X may be charged to have a voltage Vxs. Note that since the light emitting unit LD emits the light in the third timing TP3, the fingerprint sensor FS in the third timing TP3 may generate a corresponding current based on the intensity of the reflective light reflected from the finger and sensed by itself, so as to affect the voltage Vxs of the node X. In other words, the value of the voltage Vxs may correspond to the intensity of the reflective light reflected from the finger, so as to correspond to the fingerprint profile of the corresponding region. Next, in the first timing TP1 which the first scan line SC1 provides the turn-on signal to turn on the first switching component T1 and the fourth switching component T4, a current passing through the fourth switching component T4 and the fifth switching component T5 may be correspondingly generated according to the voltage Vxs. Thus, the fingerprint identifying control circuit may obtain the fingerprint profile based on this current value, thereby identifying the fingerprint.

Referring to FIG. 5, some structures in some embodiments of the present disclosure are different from FIG. 2. For instance, in FIG. 5, the touch signal line TL may be formed of the third conductive layer CL3, the second electrode TE of the fingerprint sensor FS may be formed of another conductive layer (e.g., transparent conductive material), and the second electrode TE may be electrically connected to the touch electrode TS formed of the fifth conductive layer CL5 at the position P1. Moreover, the circuit component layer 120 in FIG. 5 may optionally include a light shielding layer LS disposed between the buffer layer BF and the substrate 110. The light shielding layer LS is not only configured to reduce the chance that a portion of the semiconductor channel layer SCH is illuminated by the light from a side close to the substrate 110, but also optionally configured to make the switching component be a dual gate thin film transistor, thereby decreasing the leakage current or improving the characteristics of the switching component. In addition, the fifth switching component T5 shown in FIG. 5 is configured to amplify the fingerprint signal, and a ratio of a channel width to a channel length (W/L) of the fifth switching component T5 may be different from a ratio of a channel width to a channel length (W/L) of other the switching component. For example, the ratio of the channel width to the channel length of the fifth switching component T5 may be 0.5 times to 1 time the ratio of the channel width to the channel length of other switching component.

Figure 7:
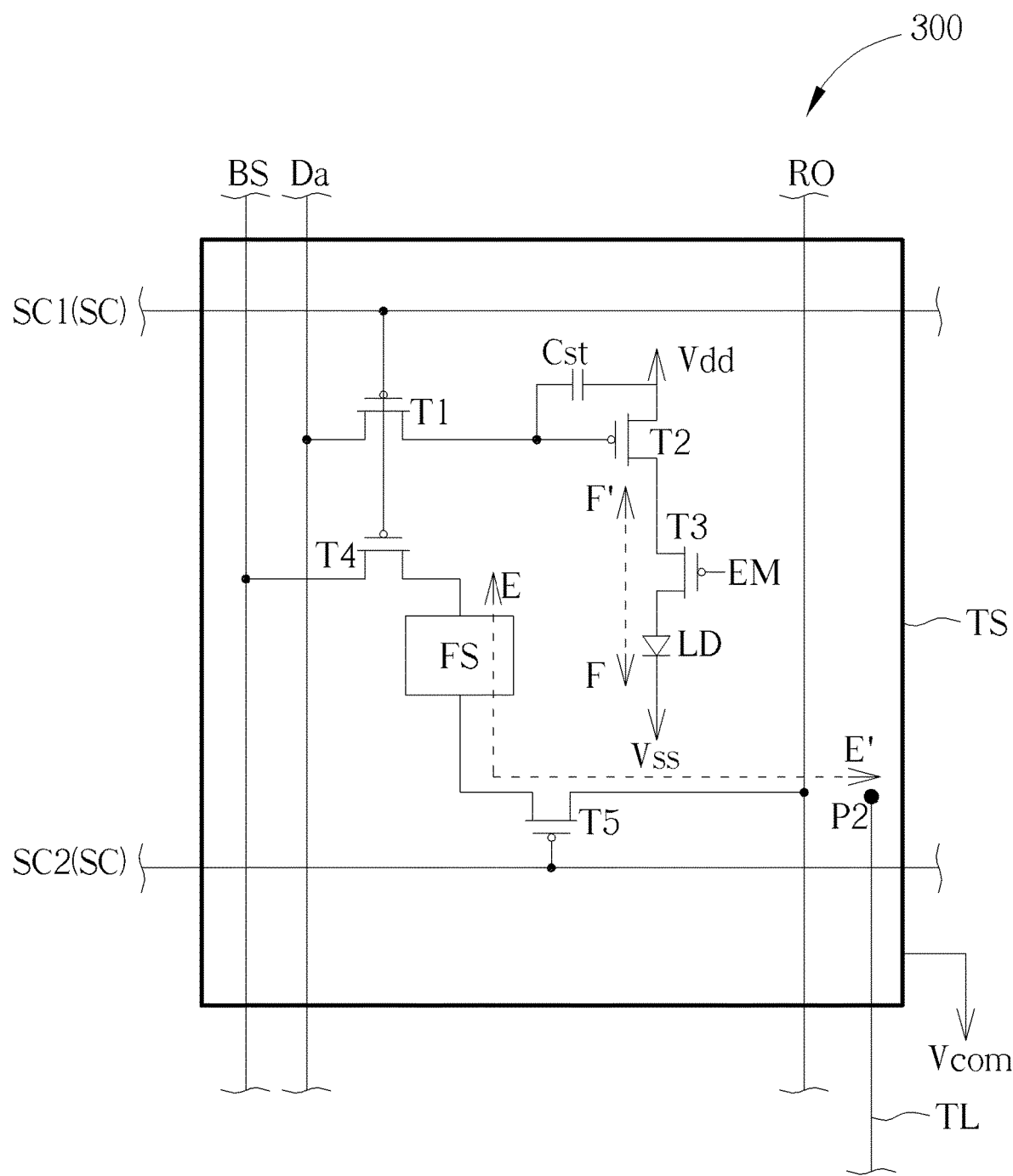
FIG. 7 is a schematic diagram showing a circuit of an electronic device according to some embodiments of the present disclosure.
Figure 8:
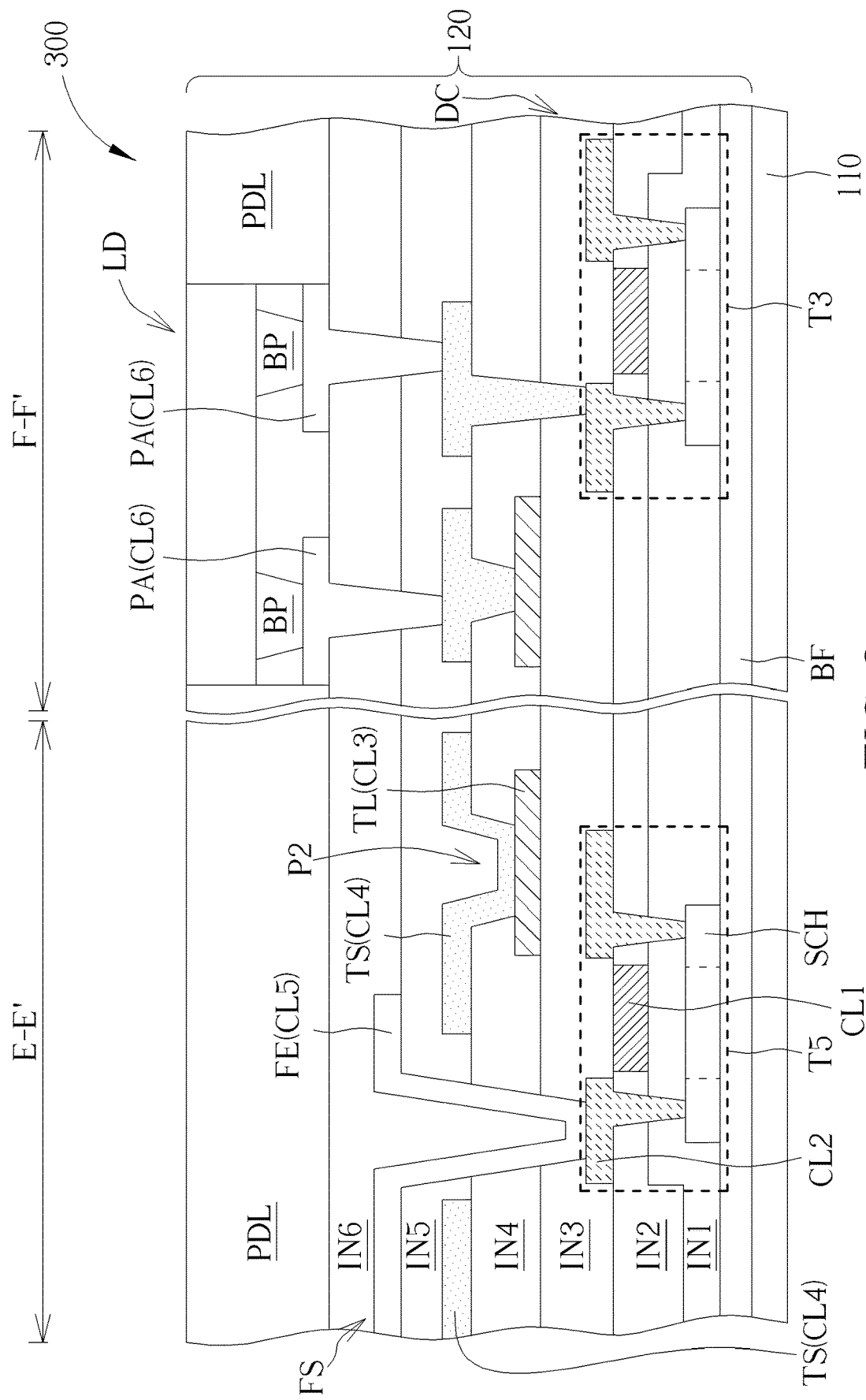
FIG. 8 is a schematic diagram showing a cross-sectional view of a structure taken along a cross-sectional line E-E' and a cross-sectional line F-F' in FIG. 7.

Referring to FIG. 7 and FIG. 8, FIG. 7 is a schematic diagram showing a circuit of an electronic device according to some embodiments of the present disclosure, and FIG. 8 is a schematic diagram showing a cross-sectional view of a structure taken along a cross-sectional line E-E' and a cross-sectional line F-F' in FIG. 7, wherein FIG. 7 only shows a circuit in one sub-pixel of the electronic device 300. As shown in FIG. 7 and FIG. 8, differences between the electronic device 300 and the electronic device 100 are the type of the fingerprint sensor FS and the design of the corresponding circuit. In some embodiments of the present disclosure, the fingerprint sensor FS includes the capacitance sensor, wherein the capacitance sensor is configured to couple with the charge on the finger to be a capacitor, and the circuit electrically connected to the capacitance sensor may be configured to detect a capacitance between the capacitance sensor and the finger. The fingerprint identifying control circuit may obtain the fingerprint profile according to the capacitance, thereby identify the fingerprint.

As shown in FIG. 7, in the driving circuit DC, in the same sub-pixel, the switching components may further include a fifth switching component T5, and the scan lines SC may include a first scan line SC1 and a second scan line SC2, wherein the first scan line SC1 is electrically connected to the gate of the first switching component T1 and the gate of the fourth switching component T4, the second scan line SC2 is electrically connected to the gate of the fifth switching component T5, and the fingerprint sensor FS is electrically connected between the fourth switching component T4 and the fifth switching component T5, but not limited thereto. Furthermore, the driving circuit DC further includes a bias voltage supply line BS electrically connected to the fourth switching component T4. The readout signal line RO is electrically connected to the fifth switching component T5.

As shown in FIG. 7 and FIG. 8, regarding the structure, the fingerprint sensor FS includes a fingerprint sensing electrode FE disposed on the touch electrode TS, and the fingerprint sensing electrode FE is electrically connected between the fourth switching component T4 and the fifth switching component T5 in the driving circuit DC. In some embodiments of the present disclosure, in top view, the fingerprint sensing electrode FE overlaps the touch electrode TS, but not limited thereto. Moreover, in some embodiments of the present disclosure, the fourth conductive layer CL4 and the fifth conductive layer CL5 include transparent conductive material, the touch electrode TS is formed of the fourth conductive layer CL4, the fingerprint sensing electrode FE is formed of the fifth conductive layer CL5, but not limited thereto. Note that another difference between the electronic device 300 and the electronic device 100 is that the electrode of the fingerprint sensor FS (the fingerprint sensing electrode FE in FIG. 8) and the touch electrode TS are not formed of the same layer and not electrically connected to each other. Furthermore, in some embodiments of the present disclosure, the touch signal line TL may be formed of such as the third conductive layer CL3, but not limited thereto.

Figure 9:
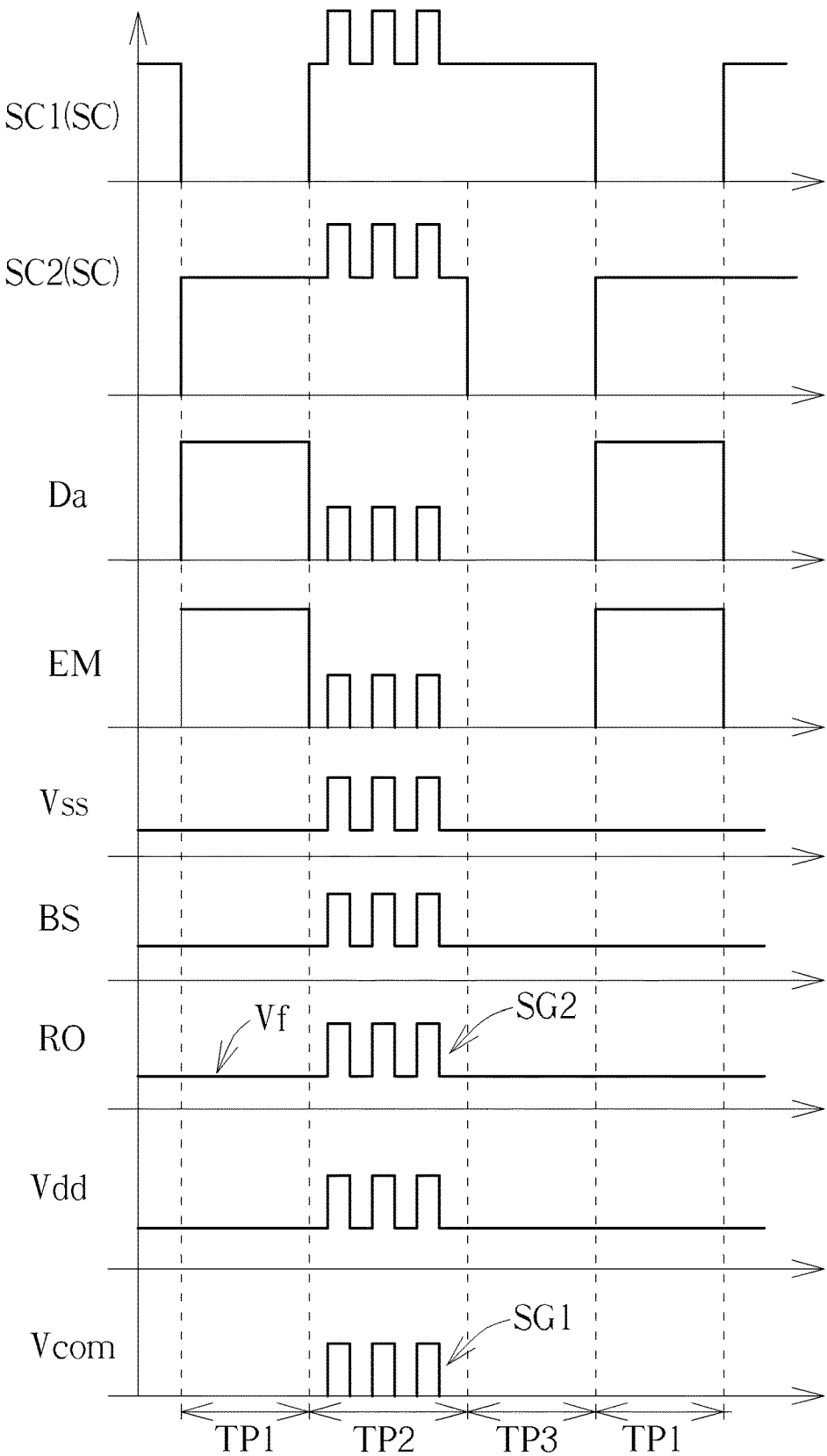
FIG. 9 is a timing diagram of a circuit of an electronic device according to some embodiments of the present disclosure.

Referring to FIG. 9, further referring to FIG. 7, FIG. 9 is a timing diagram of a circuit of an electronic device according to some embodiments of the present disclosure. Note that the profile of the circuit signal may be any suitable type. In FIG. 9, the circuit signal is a square wave as an example, but not limited thereto. In addition, although the square wave shown in FIG. 9 is an ideal square wave, the square wave provided in actuality may be a non-ideal square wave having a noise signal, a ripple effect and/or a ringing effect. In FIG. 9, the amplitude of the circuit signal is exemplary, the relations of the amplitudes of the circuit signals are not limited to FIG. 9, and FIG. 9 does not show the fingerprint sensing signal and the touch sensing signal sensed by the fingerprint sensor FS and the touch electrode TS respectively. In some embodiments of the present disclosure, the operation of the electronic device 300 may be divided into the first timing TP1, the second timing TP2 and the third timing TP3 which are alternated, wherein the display control circuit the capacitor Cst may be charged in the first timing TP1, the light emitting unit LD may emit the light in the second timing TP2 and the third timing TP3, The driving method of displaying the image is substantially similar to FIG. 3 and the above embodiment, and therefore, this content will not be redundantly described.

Regarding the fingerprint sensing function, as shown in FIG. 7 and FIG. 9, in the first timing TP1, when the first scan line SC1 provides the turn-on signal to turn on the fourth switching component T4, the fingerprint identifying control circuit may provide a bias voltage to the fingerprint sensor FS through the bias voltage supply line BS and the fourth switching component T4, and the fingerprint sensor FS may store corresponding charges according to the capacitance between the fingerprint sensing electrode FE and the finger, wherein the capacitance between the fingerprint sensing electrode FE and the finger may be changed based on the fingerprint profile of the corresponding region. For example, the capacitance between the fingerprint ridge and the fingerprint sensing electrode FE may be greater than the capacitance between the fingerprint valley and the fingerprint sensing electrode FE. In the third timing TP3, the second scan line SC2 may provide the turn-on signal to turn on the fifth switching component T5, such that the fingerprint identifying control circuit may detect the capacitance between the fingerprint sensing electrode FE and the finger through the readout signal line RO and the fifth switching component T5, thereby identifying the fingerprint.

In some embodiments of the present disclosure, the touch sensing function is performed in the second timing TP2. The driving method of the touch sensing is substantially similar to FIG. 3 and the above embodiment, and therefore, this content will not be redundantly described. Note that, in the structure shown in FIG. 8, although the fingerprint sensing electrode FE of the fingerprint sensor FS is disposed on the touch electrode TS, and the fingerprint sensing electrode FE overlaps the touch electrode TS in the top view, since the fourth switching component T4 and the fifth switching component T5 are in turn-off status in the second timing TP2, the fingerprint sensing electrode FE is floating. Accordingly, the fingerprint sensing electrode FE cannot affect the touch sensing function performed by the touch electrode TS below the fingerprint sensing electrode FE.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device having a touch sensing mode and a fingerprint sensing mode, the electronic device comprising:
    a substrate;
    a driving circuit disposed on the substrate;
    a fingerprint sensor disposed on the substrate, and the fingerprint sensor comprising a first electrode and a second electrode, wherein the first electrode is electrically connected to the driving circuit;
    a touch signal line disposed on the substrate and electrically connected to the second electrode;
    a light emitting unit;
    a first switching component electrically connected to the light emitting unit;
    a data line electrically connected to the first switching component;
    a readout signal line electrically connected to the fingerprint sensor; and
    a control circuit, wherein the control circuit provides a first signal to the touch signal line, the control circuit provides a second signal to the data line, the control circuit provides a third signal to the readout signal line, the first signal and the second signal are synchronized at the touch sensing mode, and the first signal and the third signal are synchronized at the touch sensing mode.

2. The electronic device according to claim 1, further comprising a transparent electrode, wherein the touch signal line is electrically connected to the second electrode through the transparent electrode.

3. The electronic device according to claim 1, wherein the light emitting unit is electrically connected to the driving circuit.

4. The electronic device according to claim 3, wherein the light emitting unit emits light at the touch sensing mode.

5. The electronic device according to claim 1, wherein the fingerprint sensor comprises a photo sensor.

6. The electronic device according to claim 1, further comprising a scan line electrically connected to the first switching component, wherein the control circuit provides a fourth signal to the scan line, and the first signal and the fourth signal are synchronized at the touch sensing mode.

7. The electronic device according to claim 1, wherein the second electrode of the fingerprint sensor comprises transparent conductive material.

8. The electronic device according to claim 1, wherein the driving circuit comprises a second switching component electrically connected to the first electrode of the fingerprint sensor, and the second switching component of the driving circuit is in a turn-off status at the touch sensing mode.

9. An electronic device having a touch sensing mode and a fingerprint sensing mode, the electronic device comprising:
    a substrate;
    a driving circuit disposed on the substrate;
    a touch electrode disposed on the substrate;
    a fingerprint sensor disposed on the substrate, wherein the fingerprint sensor comprises a fingerprint sensing electrode disposed on the touch electrode and electrically connected to the driving circuit;
    a touch signal line electrically connected to the touch electrode;
    a light emitting unit;

a first switching component electrically connected to the light emitting unit;

a data line electrically connected to the first switching component;

a readout signal line electrically connected to the fingerprint sensor; and a control circuit, wherein the control circuit provides a first signal to the touch signal line, the control circuit provides a second signal to the data line, the control circuit provides a third signal to the readout signal line, the first signal and the second signal are synchronized at the touch sensing mode, and the first signal and the third signal are synchronized at the touch sensing mode.

10. The electronic device according to claim 9, wherein the fingerprint sensor comprises a capacitance sensor.

11. The electronic device according to claim 9, wherein the fingerprint sensing electrode overlaps the touch electrode in top view.

12. The electronic device according to claim 9, wherein the light emitting unit is electrically connected to the driving circuit.

13. The electronic device according to claim 12, wherein the light emitting unit emits light at the touch sensing mode.

14. The electronic device according to claim 9, further comprising a scan line electrically connected to the first switching component, wherein the control circuit provides a fourth signal to the scan line, and the first signal and the fourth signal are synchronized at the touch sensing mode.

15. The electronic device according to claim 9, wherein the fingerprint sensing electrode of the fingerprint sensor comprises transparent conductive material.

16. The electronic device according to claim 9, wherein the driving circuit comprises a second switching component electrically connected to the fingerprint sensing electrode of the fingerprint sensor, and the second switching component of the driving circuit is in a turn-off status at the touch sensing mode.

* * * * *